(12) United States Patent
Juengiing

(10) Patent No.: US 7,859,050 B2
(45) Date of Patent: Dec. 28, 2010

(54) MEMORY HAVING A VERTICAL ACCESS DEVICE

(75) Inventor: Werner Juengiing, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 178 days.

(21) Appl. No.: 11/656,125

(22) Filed: Jan. 22, 2007

(65) Prior Publication Data
US 2008/0173920 A1 Jul. 24, 2008

(51) Int. Cl.
H01L 29/786 (2006.01)

(52) U.S. Cl. .................. 257/331; 257/329; 257/330

(58) Field of Classification Search ........... 257/437, 257/E31.119, E31.12, E21.029, 329–334; 438/72
See application file for complete search history.

(56) References Cited

U.S. PATENT DOCUMENTS

| 4,811,067 | A | * | 3/1989 | Fitzgerald et al. | ........... 257/301 |
| 5,196,722 | A | | 3/1993 | Bergendahl et al. | |
| 5,250,450 | A | * | 10/1993 | Lee et al. | ........... 438/270 |
| 5,414,289 | A | | 5/1995 | Fitch et al. | |
| 5,502,320 | A | | 3/1996 | Yamada | |
| 5,529,944 | A | | 6/1996 | Rajeevakumar | |
| 5,587,340 | A | | 12/1996 | Yamazaki | |
| 5,885,864 | A | | 3/1999 | Ma | |
| 6,177,699 | B1 | | 1/2001 | Perng et al. | |
| 6,476,434 | B1 | * | 11/2002 | Noble et al. | ........... 257/302 |
| 6,548,861 | B2 | * | 4/2003 | Palm et al. | ........... 257/330 |
| 6,635,540 | B2 | | 10/2003 | Akram | |
| 7,408,224 | B2 | * | 8/2008 | Kim | ........... 257/331 |
| 2004/0041188 | A1 | | 3/2004 | Bissey et al. | |
| 2006/0046407 | A1 | | 3/2006 | Juengling | |
| 2006/0291281 | A1 | * | 12/2006 | Wang et al. | ........... 365/185.05 |
| 2007/0007571 | A1 | * | 1/2007 | Lindsay et al. | ........... 257/306 |
| 2007/0205443 | A1 | | 9/2007 | Juengling | |
| 2008/0113478 | A1 | * | 5/2008 | Beigel et al. | ........... 438/243 |

FOREIGN PATENT DOCUMENTS

| DE | 3844120 A1 | 7/1989 |
| WO | WO-2008/091579 A3 | 7/2008 |
| WO | WO-2008091579 A2 | 7/2008 |

OTHER PUBLICATIONS

"European Application Serial No. 08724673.2, Office Action mailed Mar. 31, 2010", 4 pgs.

* cited by examiner

Primary Examiner—Allan R Wilson
(74) Attorney, Agent, or Firm—Schwegman, Lundberg & Woessner, P.A.

(57) ABSTRACT

Semiconductor memory devices having vertical access devices are disclosed. In some embodiments, a method of forming the device includes providing a recess in a semiconductor substrate that includes a pair of opposed side walls and a floor extending between the opposed side walls. A dielectric layer may be deposited on the side walls and the floor of the recess. A conductive film may be formed on the dielectric layer and processed to selectively remove the film from the floor of the recess and to remove at least a portion of the conductive film from the opposed sidewalls.

21 Claims, 14 Drawing Sheets

MEMORY HAVING A VERTICAL ACCESS DEVICE

TECHNICAL FIELD

The information disclosed herein relates generally to integrated circuit devices and fabrication methods, including semiconductor memory devices and methods of forming such devices.

BACKGROUND

Many electronic devices, such as personal computers, workstations, computer servers, mainframes and other computer related equipment such as printers, scanners and hard disk drives require memory devices that provide a large data storage capability, while also incurring low power consumption. One type of memory device that is well-suited for use in the foregoing devices is the dynamic random access memory (DRAM).

Briefly, and in general terms, a DRAM includes a memory array having a plurality of memory cells that are suitably arranged in rows and columns. A plurality of conductive "word lines" are positioned along the rows of the array to couple cells in respective rows, while a plurality of conductive "bit lines" are positioned along columns of the array and coupled to cells in the respective columns. The memory cells in the array include an access device, such as a transistor, and a storage device, such as a capacitor. The access device and the storage device are operably coupled so that information is stored within a memory cell by imposing a predetermined charge state (corresponding to a selected logic state) on the storage device, and accessing the charge state through the access device to retrieve the stored information.

An individual memory cell in the memory array is selected by activating a specific one of the word lines, while activating a specific one of the bit lines. Accordingly, to write to a memory cell, the selected bit line is driven to a high or a low logic state with the access device turned on for a sufficient time to charge the storage device to the high or low logic state. The access device is then turned off, leaving the selected logic state on the storage device. Since current leakage generally occurs, the storage device is periodically refreshed in order to maintain the desired logic state in the storage device. To read, or to refresh the logic state stored in the memory cell, the bit line is permitted to float when the access device is turned on, so that the small potential difference on the bit line may be sensed and suitably amplified. If the potential difference exceeds a predetermined threshold, the cell is refreshed.

In order to increase the memory capacity of DRAM devices, the surface area occupied by the components of the memory cells has steadily decreased so that the packing density of the memory cells on a semiconductor substrate may be increased. Surface area reductions and consequent increases in packing density have been achieved by an overall decrease in the feature size of the memory cell components, and by forming memory cell components that are significantly three-dimensional, so that the memory cell components extend into the substrate, in addition to generally extending across the surface of the substrate.

One useful structure that significantly increases the packing density of the memory cells in the memory device is the vertical access device. In general, the vertical access device is formed in a recess that is etched in the substrate. A pair of vertical sidewalls is thus formed, with a horizontal floor extending between the vertical sidewalls. A dielectric layer is generally applied to an interior of the recess, and a selective doping is employed to impart a desired conductivity to the side wall regions. A gate structure is typically positioned adjacent the side wall regions. The various portions of the vertical access device are then operably coupled to the various other portions of the memory device, as is well known in the art.

Although the vertical access device generally increases packing density, one significant drawback present in prior art vertical access devices is that corner regions may generate relatively high electrostatic potentials that may lead to a localized dielectric breakdown in the corner region. Although dielectric breakdown in the corner region may be at least partially arrested by increases in the thickness of dielectric insulating layers, several shortcomings stem from this approach. For example, as the thickness of a selected dielectric layer is increased, a gate capacitance in the device is reduced, which may adversely affect switching time for the device.

BRIEF DESCRIPTION OF THE DRAWINGS

The various embodiments of the present invention are described in detail below with reference to the following drawings.

DETAILED DESCRIPTION

Many of the various disclosed embodiments relate to memory devices and methods of fabricating such devices, and in particular to vertical access devices for memory devices. Specific details of certain embodiments of the invention are set forth in the following description and in FIGS. 1 through 16 to provide a thorough understanding of such embodiments. One skilled in the art, however, will understand that embodiments are possible, and that many embodiments may be practiced without several of the details described in the following description.

Figure 1:
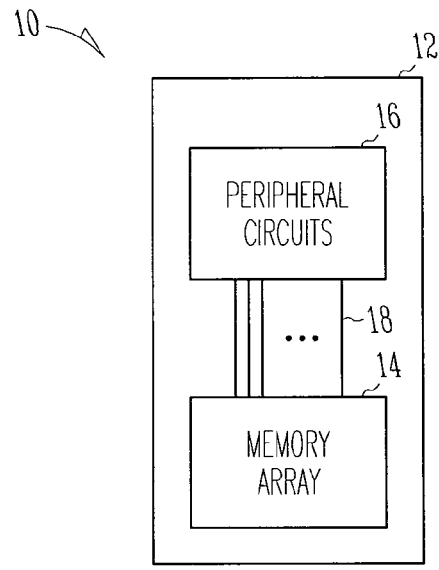
FIG. 1 is a diagrammatic block view of a memory device according to various embodiments of the invention.

FIG. 1 is a diagrammatic block view of a memory device 10 according to an embodiment of the invention. The memory device 10 is fabricated on a semiconductor substrate 12 by various fabrication methods that include selective masking, photolithography, etching, material deposition, selective doping, planarization and other known fabrication methods. A memory array 14 having a plurality of memory cells (not shown in FIG. 1) is disposed on the semiconductor substrate 12 through selective application of the foregoing fabrication methods. The memory cells included in the memory array 14 each include an access device that is structured in accordance with embodiments of the present invention, which will be discussed in greater detail below. The memory device 10 also includes one or more peripheral circuits 16 that are operably coupled to the memory array 14 by a plurality of control lines 18. The peripheral circuits 16 generally include circuits configured to address the memory cells within the memory array 14, so that information may be stored and accessed. Accordingly, the peripheral circuits 16 in the memory device 10 may include sense amplifiers, suitable multiplexing and de-multiplexing circuits, latching circuits, buffer circuits, as well as input and output circuits that are configured to communicate with external devices. The peripheral circuits 16 may also include various circuits that are operable to supply and/or regulate power to the memory device 10.

Figure 2:
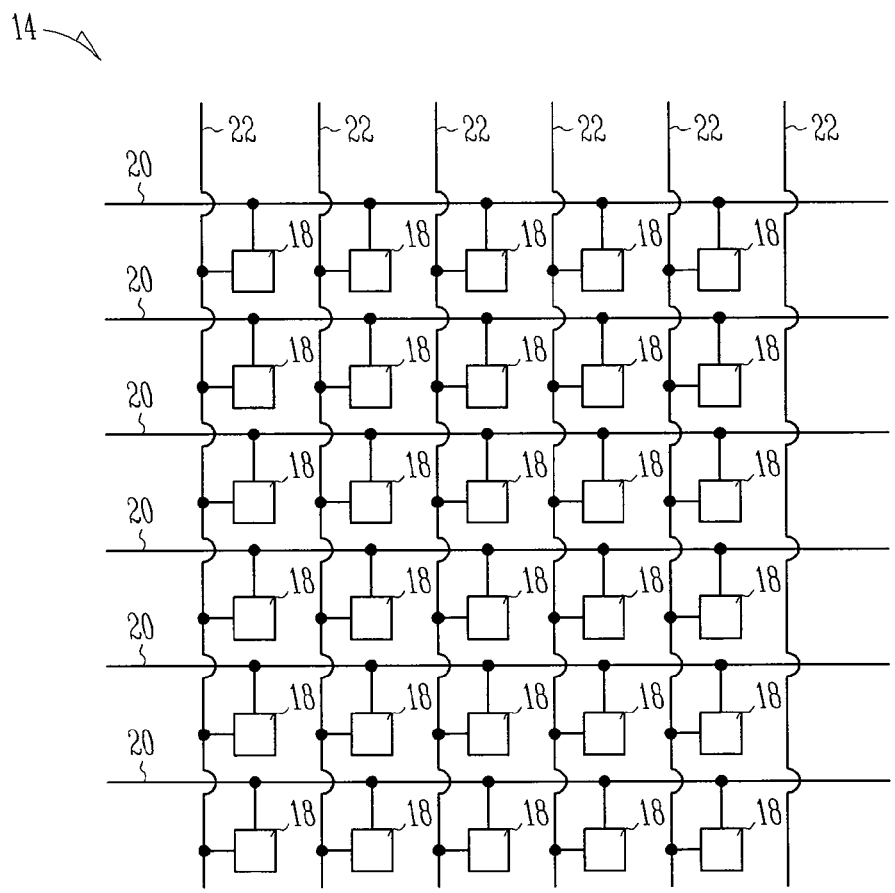
FIG. 2 is a partial schematic view of the memory array shown in FIG. 1.

FIG. 2 is a partial schematic view of the memory array 14 according to the embodiment shown in FIG. 1. The memory array 14 includes a plurality of memory cells 18 that are coupled to generally perpendicular word lines 20 and bit lines 22. The word lines 20 and the bit lines 22 cooperatively form a plurality of address lines, which may be coupled to the peripheral circuits 16 of FIG. 1. The memory cells 18 each include an access device and a storage device (not shown in FIG. 2) that are operably coupled to respective word lines 20 and bit lines 22, as will be discussed in greater detail below. In particular, the access device is structured in accordance with embodiments of the present invention, which will also be discussed in greater detail below. Although a single memory array 14 is shown, it is understood that the memory array 14 may be segregated into multiple banks, with each bank having dedicated input and output ports that are further coupled to a common internal bus, so that information may be written and accessed from different banks sequentially or simultaneously.

Figure 3:
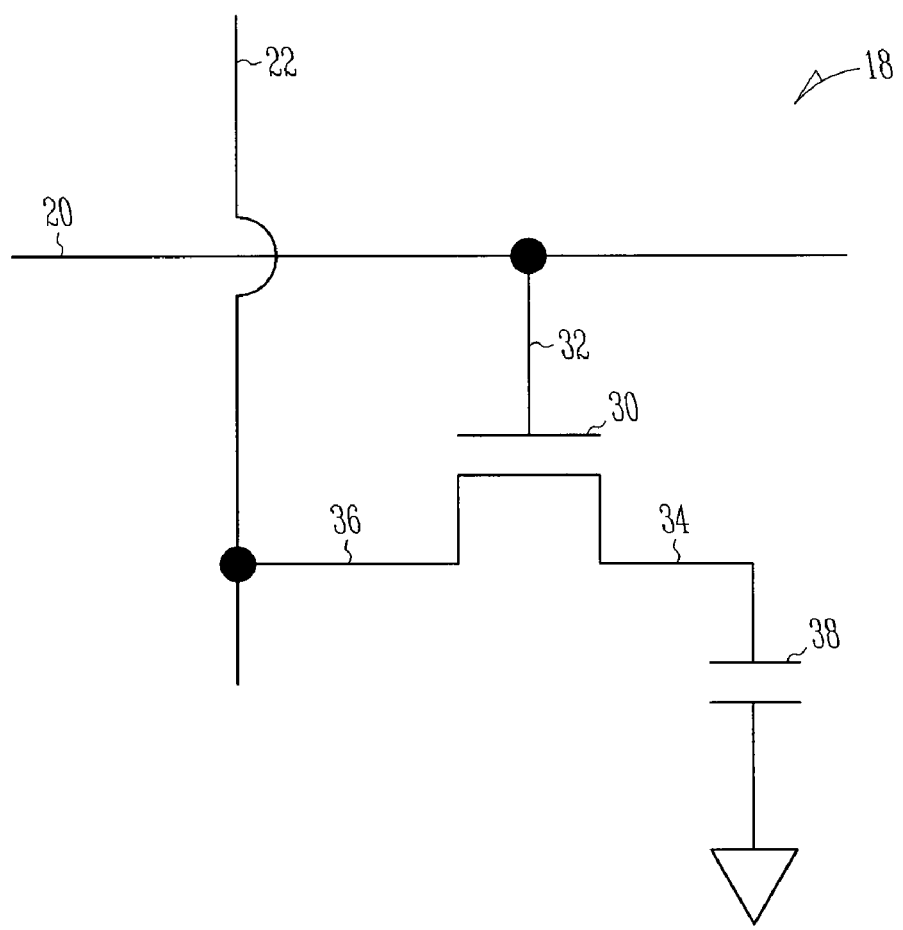
FIG. 3 is a schematic view of a memory cell of the memory array of FIG. 2.

FIG. 3 is a schematic view of the memory cell 18 according to the embodiment shown in FIG. 2. The memory cell 18 includes an access device 30, which may be a metal oxide semiconductor field effect transistor (MOSFET). Accordingly, the access device 30 may be a p-MOSFET device if a channel region is comprised of an n-type semiconductor material, or alternately, an n-MOSFET device if the channel region is comprised of a p-type semiconductor material. In either case, the access device 30 is generally formed by suitably doping the semiconductor substrate 12 (FIG. 1), which may be a bulk substrate comprised of silicon or from a mixture of semiconductor materials, such as silicon and germanium (SiGe). Alternately, the substrate 12 may include a silicon-on-insulator structure, such as a silicon-on sapphire substrate. The suitably doped regions may then be operably coupled to other portions of the memory cell 18 by interconnecting the doped regions. The interconnections may be formed from a selected metal, or alternately, from other conductive materials, such as polysilicon. Again, the access device 30 is structured in accordance with embodiments of the present invention, which will be discussed in greater detail below. The memory cell 18 also includes a storage device 38 that is coupled to the access device 30. The storage device 38 may be a capacitive structure having a suitably large capacitance, so that an adequate signal may be communicated to the peripheral circuits 16 (FIG. 1) by the access device 30. Accordingly, the capacitive structure may include three-dimensional capacitance structures, such as trench and stacked capacitor structures. For example, the capacitive structure may include the three-dimensional capacitive device as disclosed in U.S. Pat. No. 6,635,540 to DeBoer, et al. and entitled "DRAM Capacitor Formulation Using a Double-Sided Electrode", which patent is herein incorporated by reference.

Figure 4:
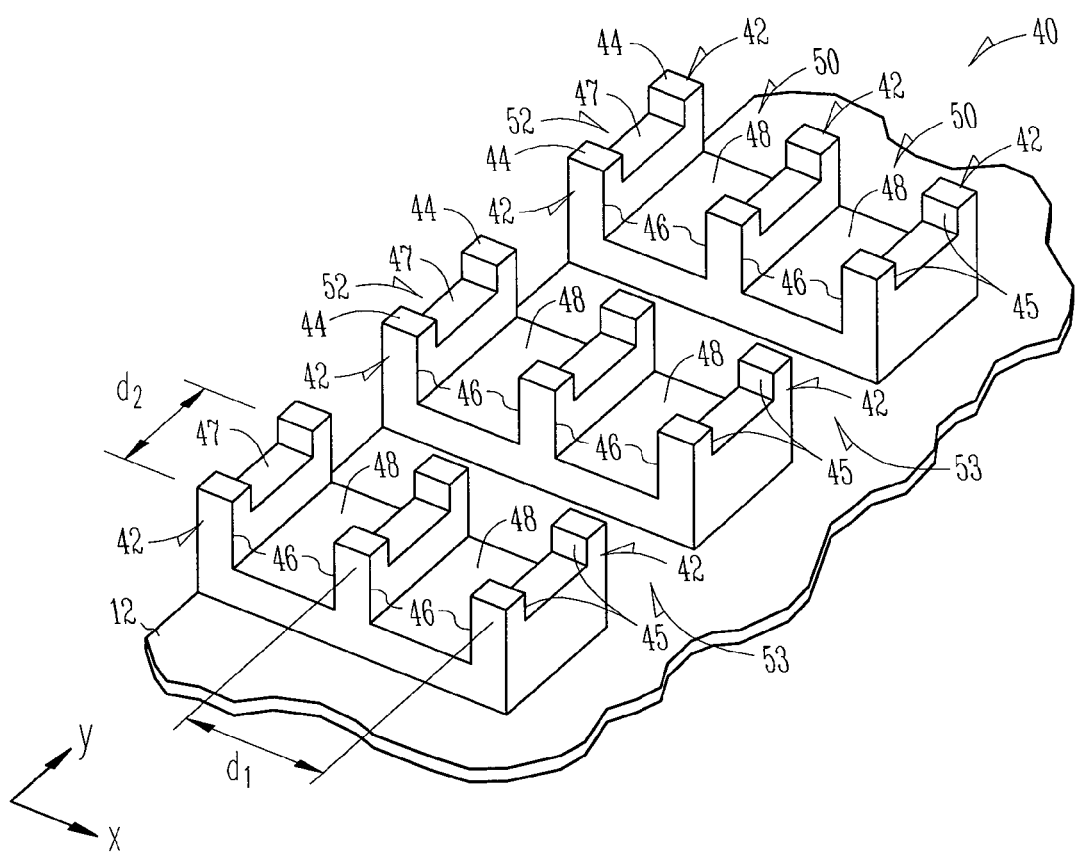
FIG. 4 is a partial isometric view of a memory device showing a plurality of vertical access devices formed according to several of the embodiments of the invention.

FIG. 4 is a partial isometric view of a memory device 40 showing a plurality of vertical access devices 42 positioned on the semiconductor substrate 12 of FIG. 1, which will be used to describe the various embodiments. For clarity of illustration, portions of the memory device 40 may be omitted, but which may be disclosed in detail in U.S. Published Application No. US 2006/0046407 A1 to Werner Juengling, filed Sep. 1, 2004 and entitled "DRAM Cells with Vertical Transistors", which application is herein incorporated by reference. Each of the vertical access structures 42 may be mutually spaced apart in an x-direction by a selected distance $d_1$. The vertical access structures 42 each include an opposing pair of columnar portions 44 that extend outwardly from the substrate 12 to define an opposing pair of generally parallel sidewalls 45 having a floor 47 extending between the sidewalls 45. The columnar portions 44 are spaced apart in the y-direction by a selected distance $d_2$. The columnar portions 44 cooperatively form the vertical access devices 42 by providing source/drain regions, and channel regions, respectively, as will be discussed in detail below. A plurality of mutually aligned first trenches 50 extend along and between the structures 42, and are configured to accommodate conductive word lines (not shown in FIG. 4) that may be deposited in the first trenches 50 by various methods, as will be described in detail below. A plurality of mutually aligned second trenches 52 that are approximately perpendicular to the first trenches 50 are defined by the sidewalls 45 and the floors 47. Relatively deep third trenches 53 are also formed in the device 40, which are approximately aligned with the second trenches 52 and are positioned between the vertical access structures 42.

Figure 5:
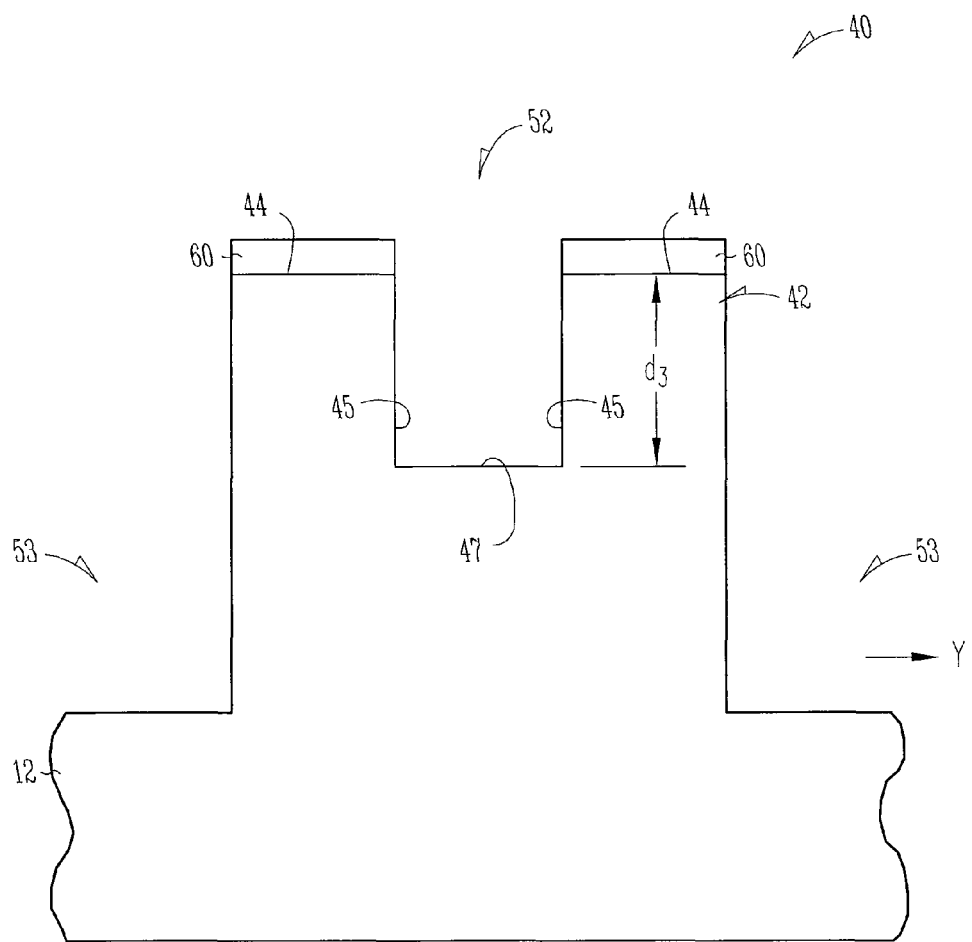
FIG. 5 is a partial side elevational view of an access device according to several of the embodiments of the invention.

FIGS. 5 through 11 will now be used to illustrate a method of forming a memory device 40 having the vertical access device 42, according to the various embodiments. Referring now to FIG. 5, a partial side elevational view of the substrate 12 is shown, that includes a dielectric layer 60 that is applied to the substrate 12 during the formation of the structure shown in FIG. 4. The semiconductor substrate 12 may include any semiconductor-based structure having a semiconductor surface, which may include silicon, silicon on insulator (SOI) and silicon on sapphire (SOS) structures. Further, the substrate 12 may include doped and undoped semiconductor materials, and/or epitaxial layers of silicon supported on a semiconductor base. Moreover, the material comprising the semiconductor substrate 12 need not be entirely silicon based. For example, the substrate 12 may also include portions formed entirely from germanium, or from silicon and germanium in combination, or from gallium arsenide. A doped structure according to the embodiments will be discussed in further detail below. The dielectric layer 60 may include any suitable dielectric material, which may include a relatively thick silicon dioxide layer that is deposited on the surface using chemical vapor deposition (CVD). Alternately, the dielectric layer 60 may be a thermally grown layer formed by exposing the substrate 12 to an oxygen atmosphere at an elevated temperature.

The vertical access structure 42 includes the second trench 52, which is formed by suitably etching the substrate 12 to a depth $d_3$. The trench 52 may be etched using a wet etch process, or it may be etched using a dry etch process, which may include plasma etching, ion milling and reaction ion etching (RIE). The trench 50 and the trench 53 are generally formed to a depth that is greater than the depth $d_3$, and may also be formed using a wet etch or a dry etching process. The trench 50 is etched to a depth of approximately about 1.5 F, where F is a relevant vertical feature size for the device 40. In general, the relevant feature size is determined by the minimum resolvable feature on a photo mask used to form the device 40. In the various embodiments, the trench 50 is approximately 1750 Angstroms (Å) in depth, although the trench 50 may be formed to other suitable depths that may be less than or greater than this depth.

Figure 6:
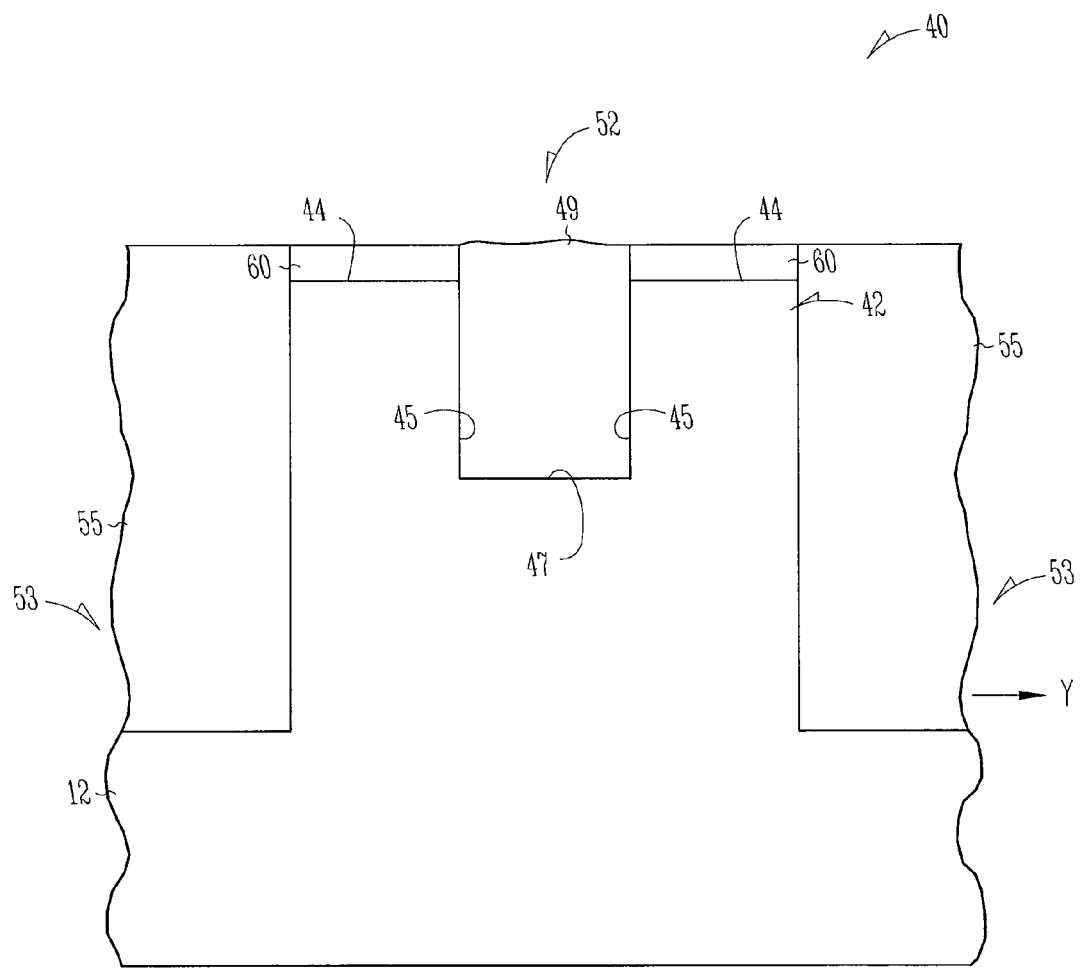
FIG. 6 is another partial side elevational view of an access device according to several of the embodiments of the invention.

Referring now to FIG. 6, a dielectric filler 49 may be deposited into the trench 52 that at least partially fills the trench 52. Although a variety of dielectric materials may be used, in the various embodiments, the dielectric filler 45 may be formed, for example, by silicon dioxide that is formed by the pyrolytic decomposition of tetra ethyl orthosilicate (TEOS) using low pressure chemical vapor deposition (LPCVD), plasma-enhanced chemical vapor deposition (PECVD), or other similar deposition methods. The trench 53 may be filled with a dielectric material 55, which may include, for example, silicon dioxide deposited using chemical vapor deposition (CVD), or by other known methods.

Figure 7:
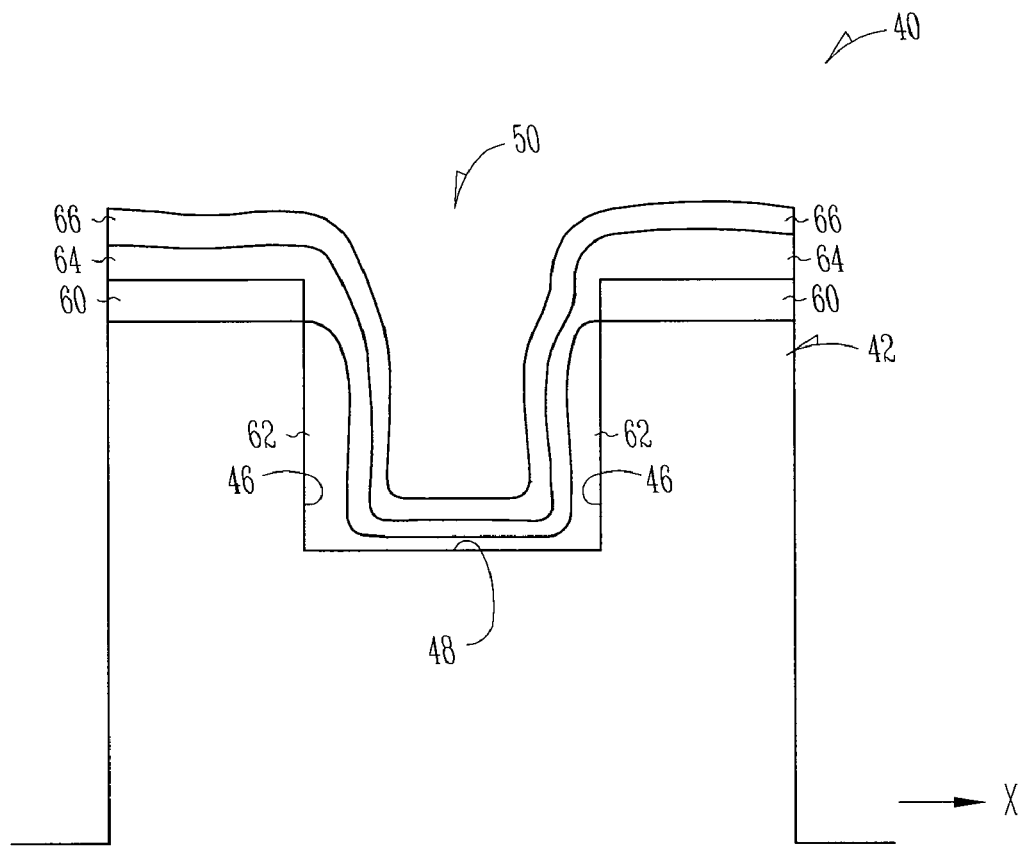
FIG. 7 is still another partial side elevational view of an access device according to several of the embodiments of the invention.

FIG. 7 is a partial side elevational view of the memory device 40 of FIG. 4, which will be used to further describe the formation method. A trench dielectric layer 62 may be deposited to the sidewalls 46 and the floor 48 of the trench 50. Although the trench dielectric layer 62 may be any suitable dielectric material that may be grown or deposited on the sidewall 46 and the floor 48, the trench dielectric layer 62 may include a thermally grown silicon dioxide ($SiO_2$) layer. In general, a thermally grown $SiO_2$ layer will develop a thickness that is governed by the crystalline orientation of the substrate 12. Accordingly, the thermally grown $SiO_2$ layer is generated to a desired thickness on the sidewalls 46, while the silicon dioxide layer developed on the floor 48 may be relatively thinner than a thickness of the $SiO_2$ layer developed on the sidewalls 46. Alternately, the trench dielectric layer 62 may include a silicon nitride ($Si_3N_4$) layer. A conductive film 64 may then be deposited to a desired thickness to at least the sidewalls 46 and the floor 48 of the trench 50, The conductive film 64 may include a metal, such as a transition metal, or it may include other conductive materials, such as titanium nitride (TiN) and tantalum nitride (TaN), and various silicides, such as cobalt silicide (CoSi) and nickel silicide (NiSi). The conductive material comprising the film 64 may also include polysilicon, which may be doped or undoped. The conductive film 64 may be deposited using chemical vapor deposition (CVD) methods, which may include a low pressure chemical vapor deposition (LPCVD). In the various embodiments, the conductive film 64 may be deposited on the sidewalls 46 and the floor 48 to a thickness that ranges between approximately 0.25 F and approximately 0.5 F, where F is a relevant feature size for the device 40. The conductive film 64 may also be formed to a thickness that ranges between approximately 150 Å and approximately 350 Å. An auxiliary layer 66 may be applied to at least the trench 50, which may include a $SiO_2$ layer or a $Si_3N_4$ layer, and may be deposited using CVD, or other suitable methods. Additionally, other suitable materials may be used for the layer 66, which may include conductive materials.

Figure 8:
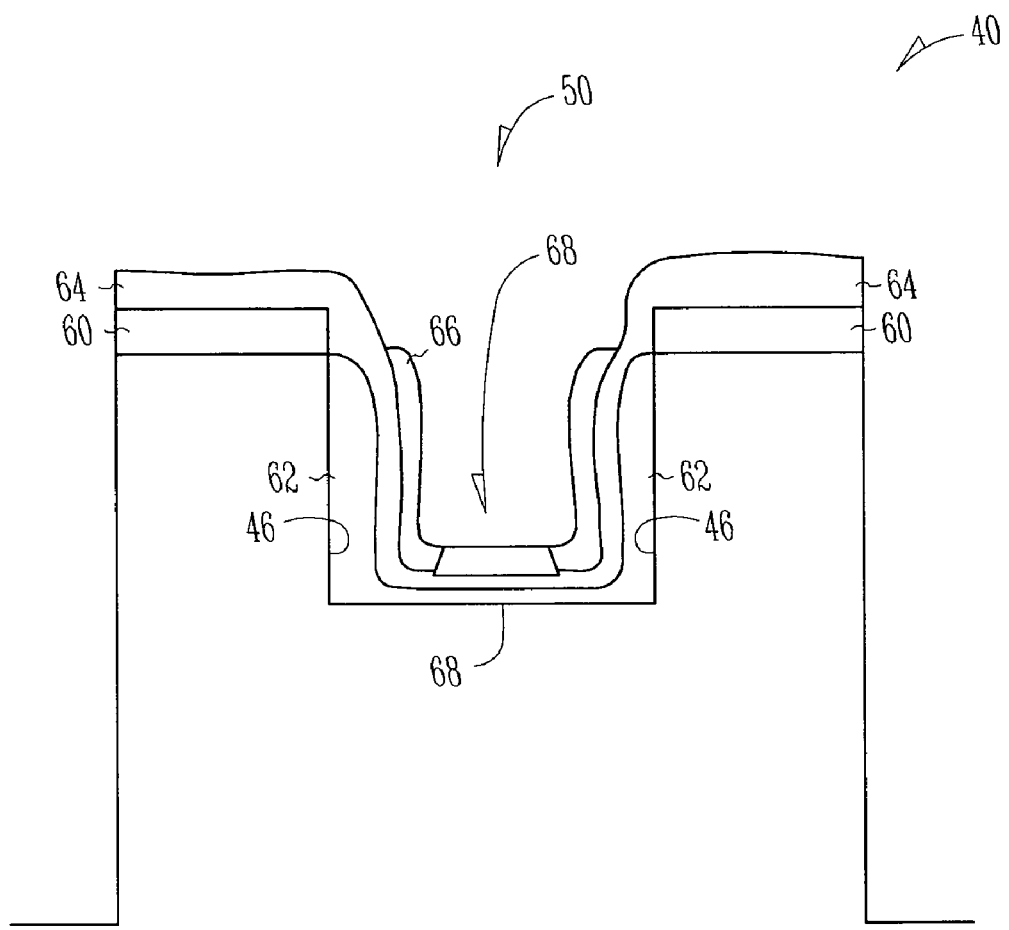
FIG. 8 is still yet another partial side elevational view of an access device according to several of the embodiments of the invention.

Referring now to FIG. 8, the auxiliary layer 66 may be selectively etched to remove portions of the auxiliary layer 66 and the conductive film 64. In the various embodiments, the bottom 68 of the trench 50 may be spacer-etched so that the auxiliary layer 66 adjacent to the bottom 68 is removed. Additionally, a portion of the conductive film 64 adjacent to the bottom 68 may be similarly removed by spacer-etching, so that the remaining portions of the conductive film 64 are mutually electrically isolated. In the various embodiments, the bottom 68 of the trench 52 may be spacer-etched through the auxiliary layer 66 and the conductive film 64 and downwardly into the trench dielectric layer 62. As shown in FIG. 8, the spacer-etch that is directed at the bottom 68 of the trench 52 also removes portions of the auxiliary layer 66 that are external to the trench 50. Spacer etching the auxiliary layer 66 and the conductive film 64 in the bottom 68 of the trench 50 may be conducted using anisotropic dry etch methods, such as plasma etching, ion beam etching and reactive ion etching (RIE).

Although FIG. 8 shows the spacer etch directed towards the auxiliary layer 66 and the conductive film 64, it is understood that the spacer etch may also be directed towards other portions of the disclosed structure. For example, the spacer etch may also etch significant portions of the underlying silicon material, or the spacer etch may effect reductions in the layer 66, the film 64 and the underlying silicon material though the selection of an appropriate etching technique.

Figure 9:
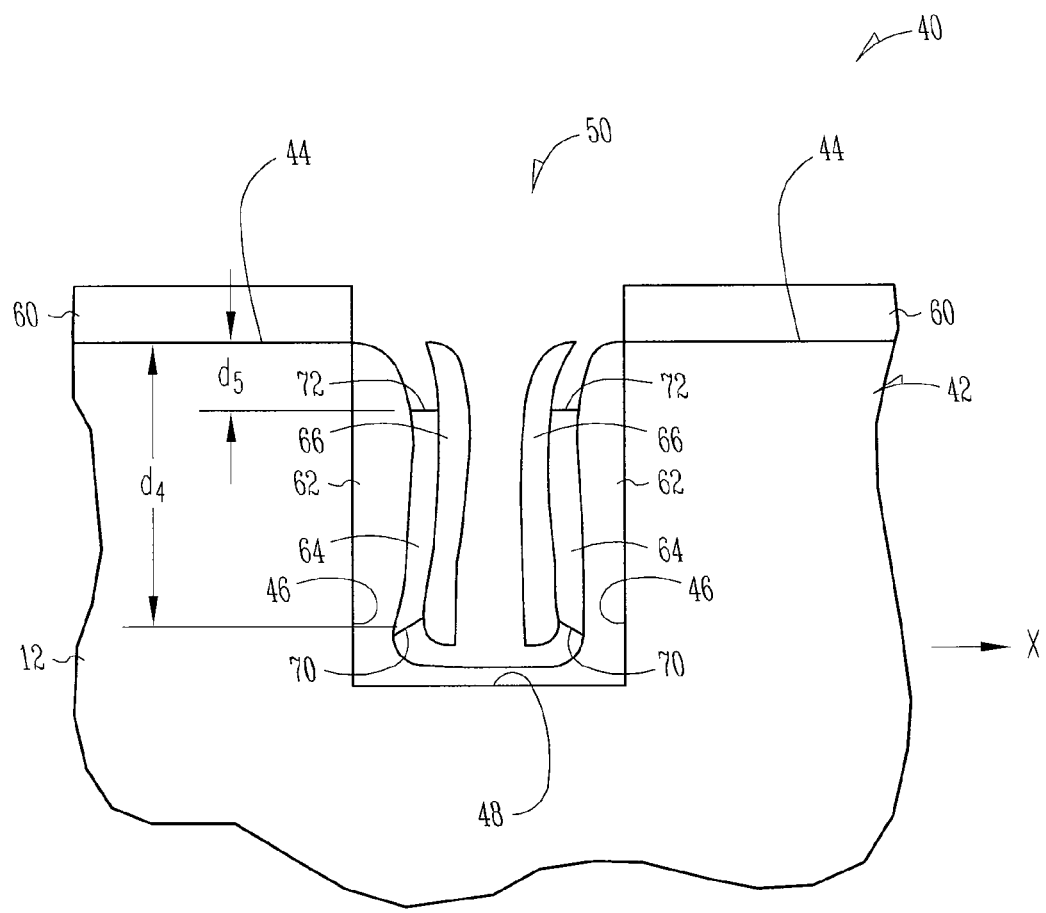
FIG. 9 is a partial side elevational view of an access device according to several of the embodiments of the invention.
Figure 10:
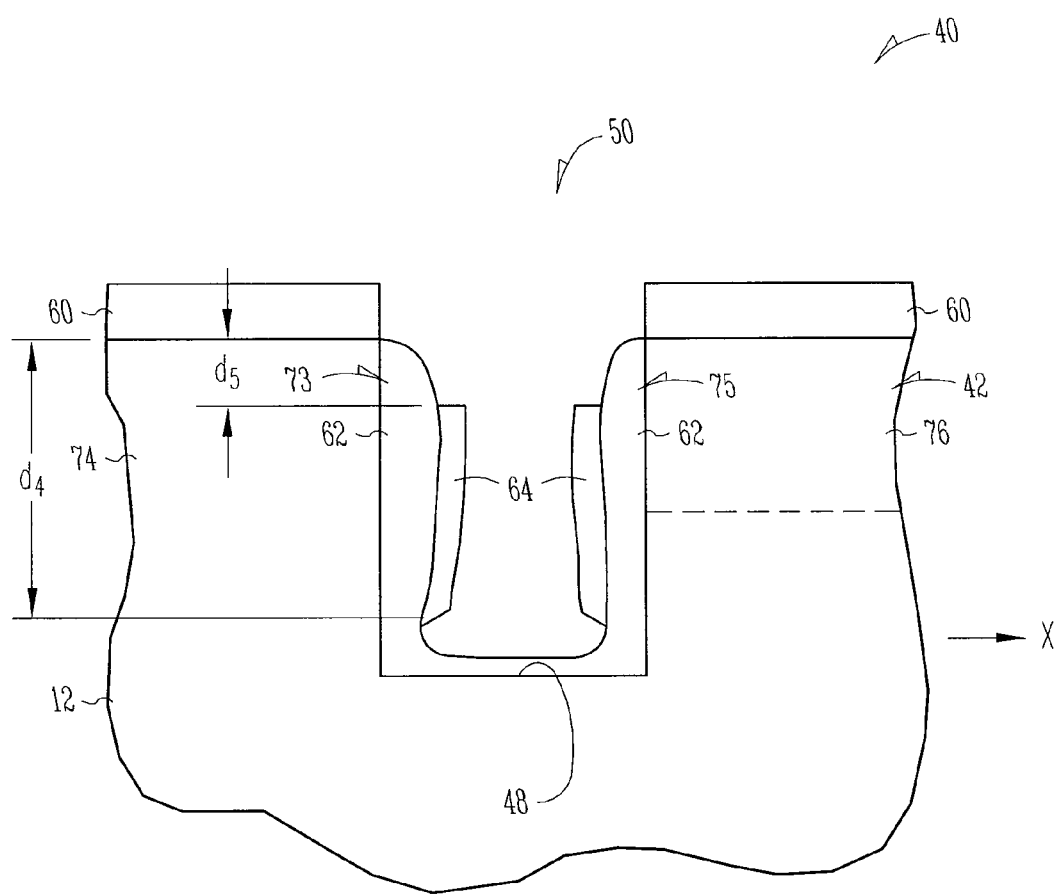
FIG. 10 is another partial side elevational view of an access device according to several of the embodiments of the invention.

Following the spacer-etch procedure shown in FIG. 8, and referring now to FIG. 9, the conductive film 64 may be further etched so that the film 64 undercuts the auxiliary layer 66. Accordingly, a lower edge 70 of the conductive film 64 extends into the trench 50 to a depth $d_4$ that is generally greater than the depth $d_3$ of the trench 52 (FIG. 5), so that the lower edge 70 is positioned away from an intersection of the side walls 46 and the floor 48. The conductive film 64 may also be etched to undercut the conductive film 64 so that an upper edge 72 extends into the trench 50 to a depth $d_5$. The locations of the lower edge 70 and the upper edge 72 may be suitably positioned using wet and/or dry etching methods to impart a desired characteristic to the device 42. For example, the locations of the lower edge 70 and the upper edge 72 may be suitably configured to provide a desired gate capacitance in the device 42, or to impart other desirable operational characteristics, such as providing a desired threshold voltage for the device 42. During the undercutting procedure shown in FIG. 9, the auxiliary layer 66 protects a longitudinal surface of the conductive film 64, so that a desired thickness t of the conductive film 64 is maintained. The remaining portions of the auxiliary layer 66 may be optionally selectively removed from the conductive film 64, as shown in FIG. 10. The selectivity of the layer 66 (FIG. 9) to removal may be enhanced by densifying the layer 66. For example, when the dielectric layer 66 includes a deposited $Si_3N_4$ layer, the layer 66 may be densified by exposing the layer 66 to a nitriding atmosphere that is maintained at predetermined conditions for a fixed period of time.

Figure 11:
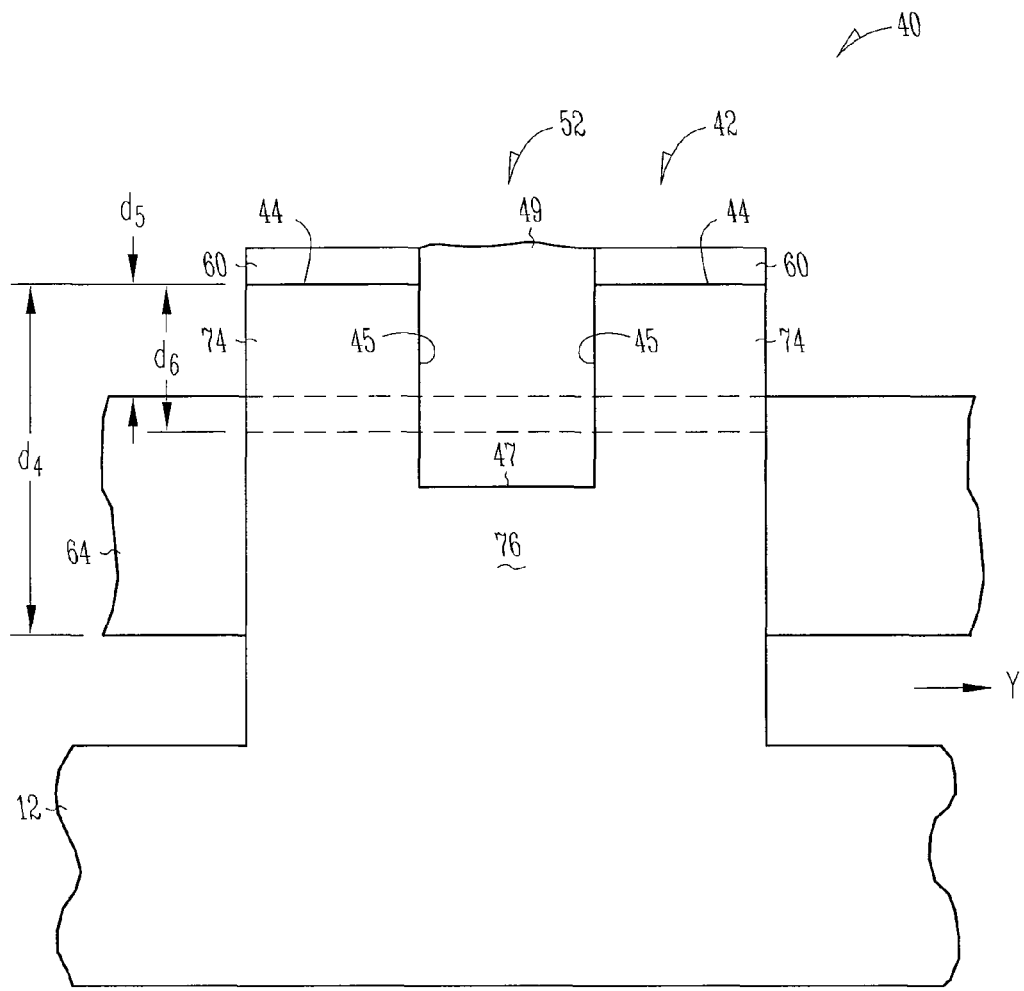
FIG. 11 is still another partial side elevational view of an access device according to several of the embodiments of the invention.

Turning now to FIG. 11, the vertical access structure 42 includes a first doped region 74 that extends at least partially in the columnar portions 44 and a second doped region 76 that extends into the substrate 12. For clarity of illustration in FIG. 11, the conductive film 64 on a frontal portion of the device 42 is removed, while the conductive film 64 on a rear portion of the device 42 is retained. It is understood, however, that the conductive film 64 may be present on opposing sides of the vertical access device 42. The first doped region 74 may be selectively formed by an ion implantation process, so that a desired conductivity is imparted to the region 74. In the various embodiments, the ion implantation process may include an angled ion implantation of a selected chemical species, so that ion implantation does not extend into the trench 52. Suitable chemical species for the ion implantation may include, for example, phosphorous, arsenic and boron ions, although other suitable chemical species may also be used.

In the various embodiments, the first doped region 74 may be doped to yield an n+ conductivity, while the second doped region 76 may be doped to yield a p− conductivity. In still another of the various embodiments, the first doped region 74 may be selectively doped to yield a p+ conductivity, while the second doped region 76 is doped to yield an n− conductivity. In other various embodiments, the first doped region 74 and the second doped region 76 may be selectively doped to yield other conductivities. For example, the first doped region 74 may be doped to yield a first conductivity, which may be either a p or an n type conductivity, and the second doped region 76 may be doped to yield a second conductivity, which may also be either a p or an n type conductivity, where the first conductivity is different than the second conductivity. In still another of the various embodiments, an additional ion implantation process may be directed into the trench 50 (FIG. 10) to improve insulative properties of the trench dielectric layer 62 and a portion of the substrate 12 that is adjacent to the floor 48 of the trench 50.

Still referring to FIG. 11, the first doped region 74 may be formed in the substrate 12 to a depth $d_6$. The depth $d_6$ may be greater than the depth $d_5$, but less than the depth $d_4$, so that the conductive film 64 extends beyond the first doped region 74. In other of the various embodiments, however, the depth $d_6$ may extend downwardly to the depth $d_4$, or even extend beyond the depth $d_4$.

Figure 12:
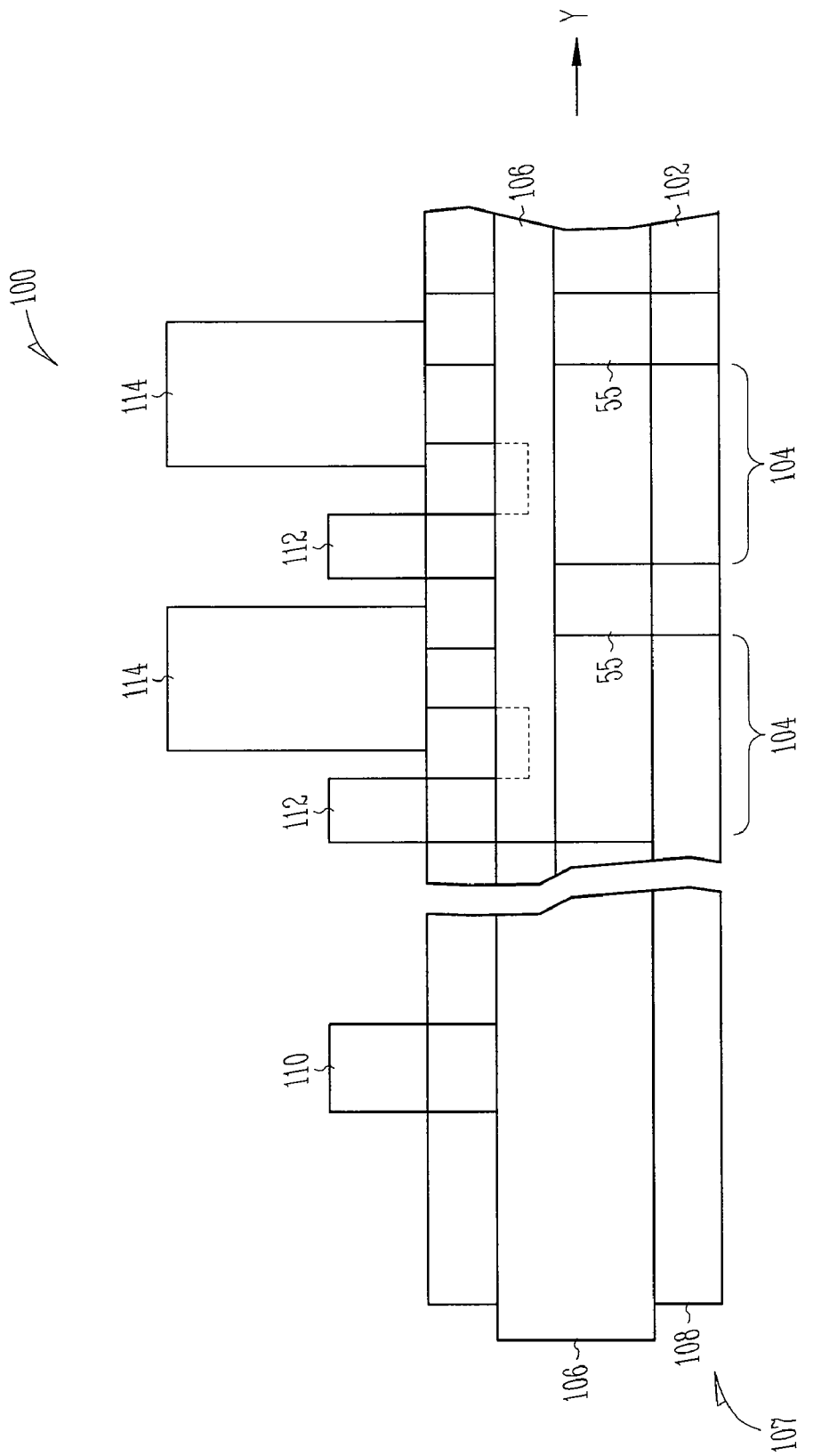
FIG. 12 is a partial side elevational view of a memory device according to several of the embodiments of the invention.
Figure 13:
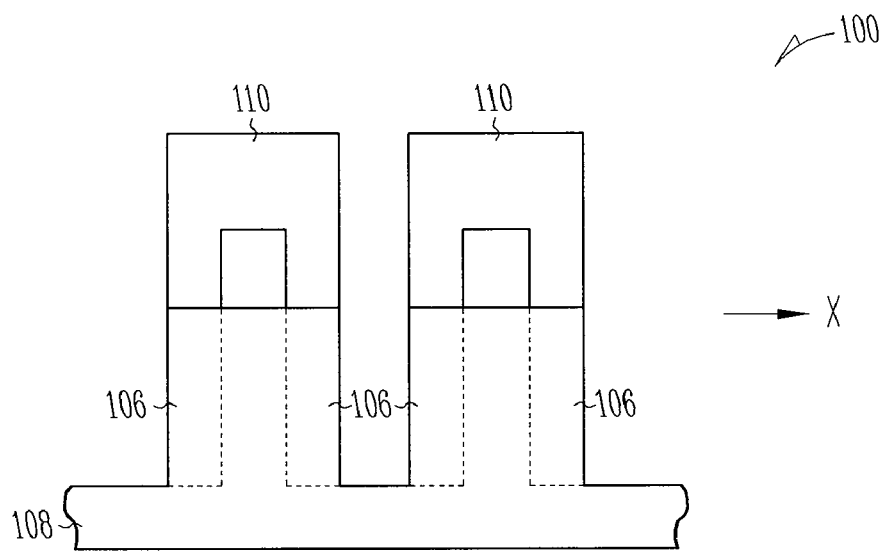
FIG. 13 is another partial side elevational view of a memory device according to several of the embodiments of the invention.

FIG. 12 is a partial side elevational view of a memory device 100 that includes at least one vertical access device formed in accordance with the various embodiments. The memory device 100 includes a supporting substrate 102, which may include a doped or undoped semiconductor material, which may be a bulk substrate of silicon. Alternately, the bulk substrate may be comprised of a mixture of semiconductor materials, such as silicon and germanium (SiGe). The substrate 102 may also include other known semiconductor structures, such as a silicon-on-insulator structure. The memory device 100 also includes at least one vertical access device 104 that is formed in accordance with the foregoing method, which abuts a dielectric material 55. The dielectric material 55 may include any of the dielectric materials previously described, such as silicon dioxide. A conductive film 106 is formed on the memory device 100 that extends across an active region of the vertical access device 104, to form a conductive word line for the device 100. As previously mentioned, the conductive film 106 may be comprised of a metallic conductive film, a semiconductor material, such as doped or undoped polysilicon, or a silicide. The conductive film 106 may extend to a terminal portion 108 of the device 100, which may be comprised of a dielectric material, such as any of the dielectric materials previously disclosed. The portion of the conductive film 106 that extends along the terminal portion 108 may abut a substantial side portion of the terminal portion 108. The conductive film 106 may also continuously extend around the terminal portion 108, and onto an opposing side of the terminal portion 108. Referring now also to FIG. 13, a rear elevational view of the memory device 100 shows the conductive film 106 as it extends around the terminal portion 108, so that the conductive film 106 couples to the conductive film 106 disposed on an opposing side of the terminal portion 109. Although the conductive film 106 is shown extending around the terminal portion 108, it is understood that the conductive film 106 on respective sides of the terminal portion 108 may be electrically coupled by providing a contact structure that extends between the film 106 on the respective sides, which will be described in further detail below.

Still referring to FIG. 12, the conductive film 106 may be coupled to a contact structure 108, which may also be suitably formed to extend across a top portion of the terminal portion 108, so that a portion of the conductive film 106 that extends along an opposing side of the terminal portion 108 is also coupled to the contact structure 108. The contact structure 108 may be comprised of a metal that is disposed on the terminal portion 108 by known metal deposition methods. The contact structure 108 may also be comprised of conductive, non-metallic materials, such as doped or undoped polysilicon, or even a silicide material. Other structures may be included in the memory device 100 to permit the device 100 to operate as a non-volatile memory device. One or more conductive structures 112 may be operably coupled to the access device 104, which form conductive bit lines for the device 100. The conductive structure 112 may also be comprised of a metal that is disposed the access device 104 by known methods. The conductive structure 112 may also be comprised of conductive, non-metallic materials, such as doped or undoped polysilicon, or even a silicide material. A storage device 114 may also be operably coupled to the access device 104 to provide a storage means for a predetermined logic state. The storage device 114 may include a container capacitor, or other similar structures, which are generally formed during the fabrication of the device 100.

Figure 14:
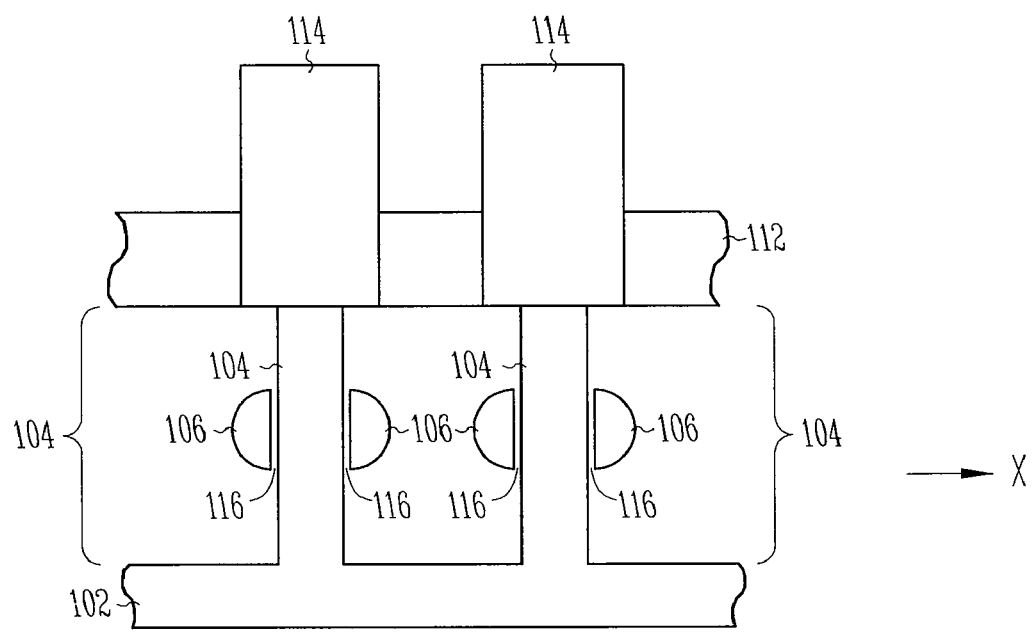
FIG. 14 is another partial side elevational view of a memory device according to several of the embodiments of the invention.

FIG. 14 is another side elevational view of the memory device 100. The memory device 100 further includes a dielectric layer 116 that is positioned between the conductive film 106 and the access device 104. The dielectric layer 116 may be formed according the foregoing methods, and may be comprised of any of the previously disclosed dielectric materials.

Figure 15:
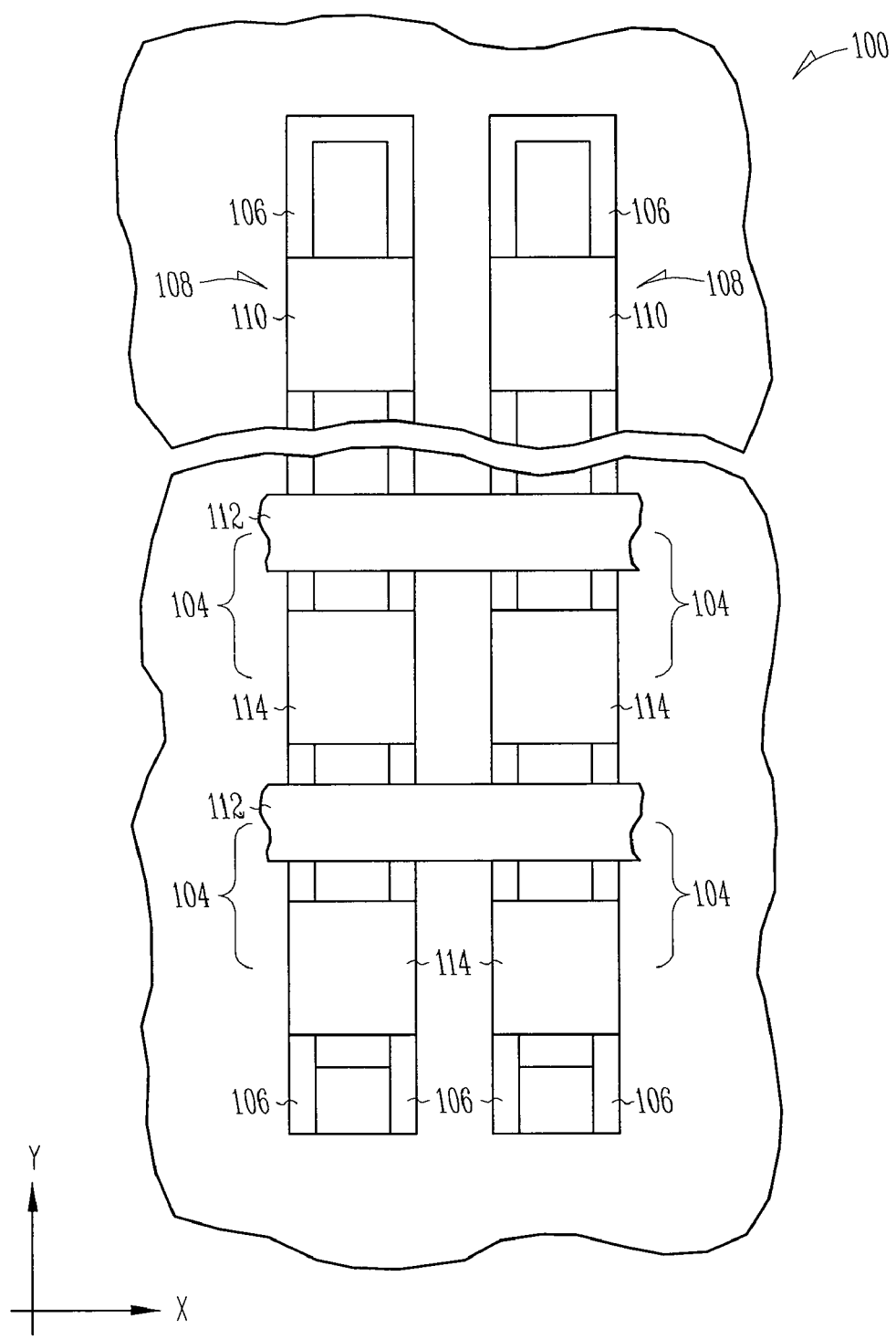
FIG. 15 is a partial top plan view of a memory device according to several of the embodiments of the invention.

FIG. 15 is a partial top plan view of the memory device 100. As shown therein, the conductive film 106 and the conductive structure 112 cooperatively form a network of approximately perpendicular word lines and bit lines, respectively, which are coupled to access devices 104, which, in turn, may be operably coupled to storage devices 114 to form the memory device 100. Although only a portion of a memory array is shown in FIGS. 12 through 15, it is understood that the memory device 100 may be segregated into different memory banks, as is known in the art. Further, memory device 100 may also include sense amplifiers, addressing circuits, latching circuits, multiplexing circuits, and other known circuits that are not shown in FIG. 15.

Figure 16:
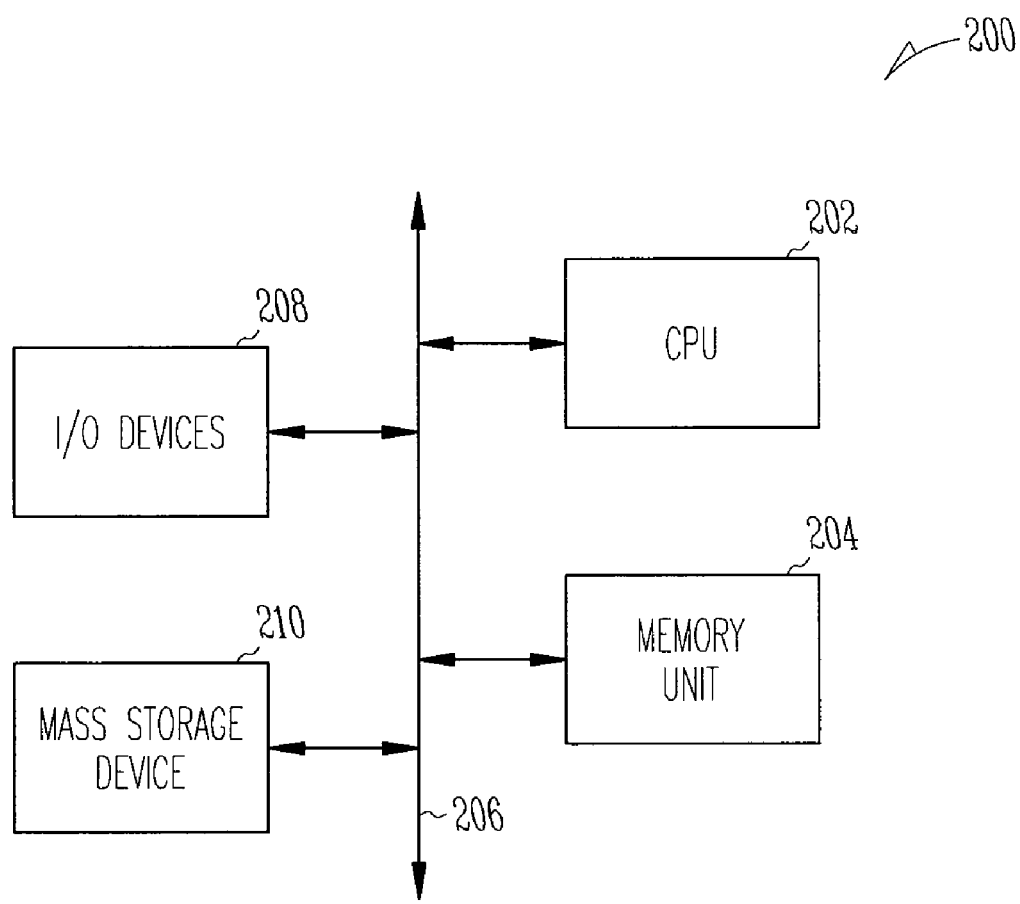
FIG. 16 is a diagrammatic block view of a processing system according to another embodiment of the invention.

FIG. 16 is a diagrammatic block view of a processing system 200 according to another embodiment of the invention. The processing system 200 includes a central processing unit (CPU) 202, which may include any digital device capable of receiving data and programmed instructions that is further configured to process the data according to the programmed instructions. Accordingly, the CPU 202 may include a microprocessor, such as a general purpose single-chip or multi-chip microprocessor, or it may include a digital signal processing unit, or other similar programmable processing units. The CPU 202 is configured to communicate with a memory unit 204 over a communications bus 206. The memory unit 204 includes a vertical access device that is structured in accordance with the foregoing embodiments of the invention, such as the vertical access device 42 shown in FIG. 12. The processing system 200 may also include various other devices that are coupled to the bus 206, which are operable to cooperatively interact with the CPU 202 and the memory unit 204. For example, the processing system 200 may include one or more input/output (I/O) devices 208, such as a printer, a display device, a keyboard, a mouse, or other known input/output devices. The processing system 200 may also include a mass storage device 210, which may include a hard disk drive, a floppy disk drive, an optical disk device (CD-ROM), or other similar devices.

While the various embodiments of the invention have been illustrated and described, as noted above, many changes can be made without departing from the spirit and scope of the invention. For example, although several embodiments of the vertical access device are described with reference to a DRAM memory device, it is understood that the several embodiments may also be incorporated, without significant modification, in a wide variety of other memory devices, such as a static memory, a dynamic memory, such as a dynamic random access memory (DRAM), an extended data out (EDO) DRAM, a synchronous dynamic random access memory, a double data rate synchronous dynamic random access memory (DDR SDRAM), a synchronous link dynamic random access memory (SLDRAM), a video random access memory (VRAM), a RAMBUS dynamic random access memory (RDRAM), a static random access memory (SRAM), a flash memory, as well as other known memory devices.

The accompanying drawings that form a part hereof show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features may be grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A memory array for a memory device, comprising:
a plurality of memory cells formed on a semiconductor substrate and coupled to word lines and generally perpendicular bit lines formed on the substrate, each memory cell further comprising:
a storage device; and
an access device formed in the substrate that is coupled to the storage device and to a selected one of the word lines and a selected one of the bit lines, the array further comprising:
a plurality of recesses each formed in the semiconductor substrate that includes a pair of opposing side walls and a floor extending there between, the side walls including active regions of the access device having a selected conductivities, wherein the active regions are confined to the side walls;
a conductive film structure that includes non-contiguous portions partially disposed on opposing side walls of the recess;
a dielectric layer interposed between the active regions and the conductive film structure; and
a plurality of trenches formed between adjacent ones of the recesses, extending in a direction substantially perpendicular to the pairs of opposing side walls of the plurality of recesses, and having a depth greater than a depth of the recesses; with
a plurality of other trenches formed between adjacent ones of the recesses, substantially in parallel with the recesses, and having a depth greater than a depth of the recesses.

2. The memory array of claim 1, wherein the recess extends into the substrate to a recess depth, and the conductive film structure extends along respective side walls of the recess to a depth that is less than the recess depth.

3. The memory array of claim 1, wherein the active regions extend into the side walls to a first depth, and the conductive film structure extends along respective side walls of the recess to a second depth that is greater than the first depth.

4. The memory array of claim 3, wherein the conductive film structure further comprises an upper edge, wherein the upper edge is recessed within the recess to a third depth that is less than the first depth and the second depth.

5. The memory array of claim 1, wherein the conductive film structure comprises a lower edge that extends away from an intersection of the side walls and the floor.

6. The memory array of claim 1, wherein the dielectric layer further comprises a trench dielectric layer that substantially covers the floor and the pair of opposing side walls.

7. The memory array of claim 1, wherein the active regions are doped to impart at least one of an n+ and a p− conductivity to the active regions.

8. The memory array of claim 1, wherein the storage device further comprises a three-dimensional capacitor structure.

9. A memory array for a memory device, comprising:
a plurality of memory cells formed on a semiconductor substrate and coupled to word lines and generally perpendicular bit lines formed on the substrate, each memory cell further comprising:
a plurality of storage devices; and
a plurality of access devices formed in the substrate that are operably coupled to the storage device and to a selected one of the word lines and a selected one of the bit lines, the array further comprising:

a plurality of recesses each formed in the semiconductor substrate that extends between the access devices and includes a pair of opposing side walls and a floor extending there between, wherein the side walls include active regions of the access devices, wherein the active regions are confined solely to the side walls;

a conductive film structure that includes non-contiguous portions at least partially disposed on opposing side walls of the recess;

a dielectric layer interposed between the active regions and the conductive film structure; and a plurality of trenches formed between adjacent ones of the recesses, extending in a direction substantially perpendicular to the pairs of opposing side walls of the plurality of recesses, and having a depth greater than a depth of the recesses; with a plurality of other trenches formed between adjacent ones of the recesses, substantially in parallel with the recesses, and having a depth greater than a depth of the recesses.

10. The memory array of claim 9, wherein the recess extends into the substrate to a recess depth, and the conductive film structure extends along respective side walls of the recess to a depth that is less than the recess depth.

11. The memory array of claim 9, wherein the active regions extend into the side walls to a first depth, and the conductive film structure extends along respective side walls of the recess to a second depth that is greater than the first depth.

12. The memory array of claim 11, wherein the conductive film structure further comprises an upper edge, wherein the upper edge is recessed within the recess to a third depth that is less than the first depth and the second depth.

13. The memory array of claim 9, wherein the conductive film structure comprises a lower edge that extends away from an intersection of the side walls and the floor.

14. The memory array of claim 9, wherein the dielectric layer further comprises a trench dielectric layer that substantially covers the floor and the pair of opposing side walls.

15. The memory array of claim 9, wherein the active regions are doped to impart at least one of an n+ and a p− conductivity to the active regions.

16. The memory array of claim 9, wherein the storage device further comprises a three-dimensional capacitor structure.

17. The memory array of claim 9, further comprising a terminal portion that includes a first side and an opposing second side, wherein the terminal portion adjoins one of the opposing side walls, and is substantially aligned with the recess.

18. The memory array of claim 17, wherein the terminal portion is comprised of a dielectric material.

19. The memory array of claim 17, wherein the conductive film extends along the terminal portion.

20. The memory array of claim 19, further comprising an end portion of the terminal portion that extends between the first side and the opposing second side, wherein the conductive film continuously extends along the first side, the end portion and onto the opposing second side.

21. The memory array of claim 19, further comprising a contact structure coupled to the conductive film.

* * * * *

UNITED STATES PATENT AND TRADEMARK OFFICE
CERTIFICATE OF CORRECTION

| | | |
|---|---|---|
| PATENT NO. | : 7,859,050 B2 | Page 1 of 1 |
| APPLICATION NO. | : 11/656125 | |
| DATED | : December 28, 2010 | |
| INVENTOR(S) | : Werner Juengling | |

It is certified that error appears in the above-identified patent and that said Letters Patent is hereby corrected as shown below:

On the title page, item (75), in "Inventor", in column 1, line 1, delete "Werner Juengiing" and insert -- Werner Juengling --, therefor.

Signed and Sealed this
Twenty-second Day of February, 2011

David J. Kappos
*Director of the United States Patent and Trademark Office*